United States Patent [19]
Bae

[11] Patent Number: 5,467,039
[45] Date of Patent: Nov. 14, 1995

[54] CHIP INITIALIZATION SIGNAL GENERATING CIRCUIT

[75] Inventor: Myung-Ho Bae, Suwon, Rep. of Korea

[73] Assignee: Samsung Electronics Co., Ltd., Suwon, Rep. of Korea

[21] Appl. No.: 268,523

[22] Filed: Jul. 6, 1994

[30] Foreign Application Priority Data

Jul. 8, 1993 [KR] Rep. of Korea .................. 12807/1993

[51] Int. Cl.⁶ .......................... H03K 17/22; H03K 5/153; H03K 17/687
[52] U.S. Cl. .......................... 327/198; 327/143; 327/77; 327/78
[58] Field of Search .................. 327/77, 78, 143, 327/198, 264, 285, 288

[56] References Cited

U.S. PATENT DOCUMENTS

| | | | |
|---|---|---|---|
| 4,558,233 | 12/1985 | Nakamori | 307/362 |
| 4,633,107 | 12/1986 | Norsworthy | 307/594 |
| 4,902,910 | 2/1990 | Hsieh | 307/296.4 |
| 4,939,385 | 7/1990 | Dubujet | 307/296.8 |
| 5,212,412 | 5/1993 | Atriss et al. | 307/296.4 |
| 5,278,458 | 1/1994 | Holland et al. | 307/272.3 |
| 5,287,011 | 2/1994 | Koshikawa et al. | 307/272.3 |

*Primary Examiner*—Timothy P. Callahan
*Assistant Examiner*—Eunja Shin
*Attorney, Agent, or Firm*—Robert A. Westerlund; Stephen R. Whitt; Charles R. Donohoe

[57] ABSTRACT

A circuit which is particularly useful as a chip initialization signal generating circuit for initializing the circuits of a semiconductor memory device includes a time delay circuit for generating a second signal a predetermined time after a first signal, e.g., a power supply voltage, is applied thereto, a first inverter for generating a third signal having a first logic level when the second signal is below a trip point level of the first inverter, and a second logic level when the second signal is above the trip point level, and, a trip point level raising circuit coupled to the first inverter for raising the trip point level. The circuit preferably further includes a second inverter for generating a fourth signal having a logic level which is the inverse of the third signal, a direct current path cutoff circuit coupled to the second inverter for cutting off a direct current path through the second inverter, and a buffer circuit for producing the chip initialization signal by appropriately shaping the fourth signal.

8 Claims, 4 Drawing Sheets

CHIP INITIALIZATION SIGNAL GENERATING CIRCUIT

BACKGROUND OF THE INVENTION

The present invention relates generally to signal generating circuits, and, more particularly, to a signal generating circuit which is particularly useful as a chip initialization signal generating circuit for a semiconductor memory device.

In general, when a semiconductor memory device is powered up, an applied power supply voltage is gradually raised to a stable operating voltage level. If the power supply voltage is utilized prior to its having reached its stable operating voltage level, malfunction of the semiconductor memory device may occur. In order to prevent this from occurring, a chip initialization circuit is employed for initializing the circuits within the semiconductor memory device.

A conventional chip initialization circuit includes a time delay circuit and at least one inverter coupled to the output of the time delay circuit. The time delay circuit functions to generate an output signal delayed by a predetermined time period from the time that the power supply voltage is applied thereto. The inverter(s) functions to produce a chip initialization signal by appropriately shaping the output signal of the time delay circuit.

With reference now to FIG. 1, there can be seen an exemplary conventional chip initialization circuit, which includes a time delay circuit 105, a first inverter 110, and a second inverter 25. The time delay circuit 105 is comprised of a diode-connected PMOS transistor 5 connected between a power supply voltage and an output node N1, and a capacitor 10 connected between the output node N1 and ground. The first inverter 110 includes a PMOS transistor 15 and an NMOS transistor 20 connected in series between the power supply voltage and ground, with the gates of the transistors 15, 20 being commonly coupled to the output node N1 of the time delay circuit 105. The second inverter 25 is coupled to the output node of the first inverter 110 and produces a chip initialization signal ØVCCH having desired characteristics.

In operation, when the power supply voltage is applied to the circuit, the node N1 is raised to the level of the power supply voltage after a time delay defined by the RC time constant of the time delay circuit 105, it being understood that the diode-connected transistor 5 functions as a resistor element having a resistance R and the capacitor 10 has a capacitance C. When the node N1 reaches the trip point level of the first inverter 110, the chip initialization signal ØVCCH is driven to a "high" logic level, to thereby initialize the circuits within the semiconductor memory device (not shown).

The above-described conventional chip initialization signal generating circuit suffers from the following drawback/shortcoming. More particularly, with the conventional chip initialization signal generating circuit, the chip initialization signal ØVCCH is sometimes generated before the power supply voltage reaches its stable operating level (i.e., its "full" power supply voltage level), because the node N1 reaches the trip point level of the first inverter 110 before the full power supply voltage level is attained, thereby resulting in malfunction of the semiconductor memory device.

Based on the above, it can be appreciated that there presently exists a need for a chip initialization signal generating circuit which overcomes the above-described shortcomings of the presently available chip initialization signal generating circuits. The present invention fulfills this need.

SUMMARY OF THE INVENTION

The present invention encompasses a circuit which includes a time delay circuit for generating a second signal a predetermined time after a first signal is applied thereto, a first inverter circuit coupled to the second signal for generating a third signal, the third signal having a first logic level when the second signal is below a trip point level, and a second logic level when the second signal is above the trip point level, and, a trip point level raising circuit coupled to said first inverter circuit for raising the trip point level of the first inverter circuit. The circuit of the present invention is particularly useful as a chip initialization signal generating circuit of a semiconductor memory device.

In a preferred embodiment, the circuit further includes a second inverter circuit coupled to the third signal for generating a fourth signal having a logic level which is the inverse of the third signal, and a buffer circuit for shaping the fourth signal, which can conveniently serve as a chip initialization signal for initializing the circuits of a semiconductor memory device. When the circuit is used as a chip initialization signal generating circuit, the first signal can conveniently be the power supply voltage applied to the semiconductor memory device, or a voltage signal derived therefrom.

In a particular preferred embodiment of the present invention, the first and second inverter circuits, and the buffer circuit, are each implemented with a CMOS inverter. Further, the trip point level raising circuit is preferably embodied as a circuit which includes at least one diode-connected NMOS transistor coupled to the source electrode of an NMOS transistor of the first inverter circuit. The circuit also preferably includes a direct current path cutoff circuit coupled to the second inverter circuit for cutting off a direct current path through the second inverter circuit. Most preferably, the trip point level raising circuit includes a plurality, N, of diode-connected NMOS transistors coupled to the source electrode of the NMOS transistor of the first inverter circuit, and the direct current path cutoff circuit includes a plurality, N–1, of diode-connected NMOS transistors coupled to the source electrode of an NMOS transistor of the second inverter circuit.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
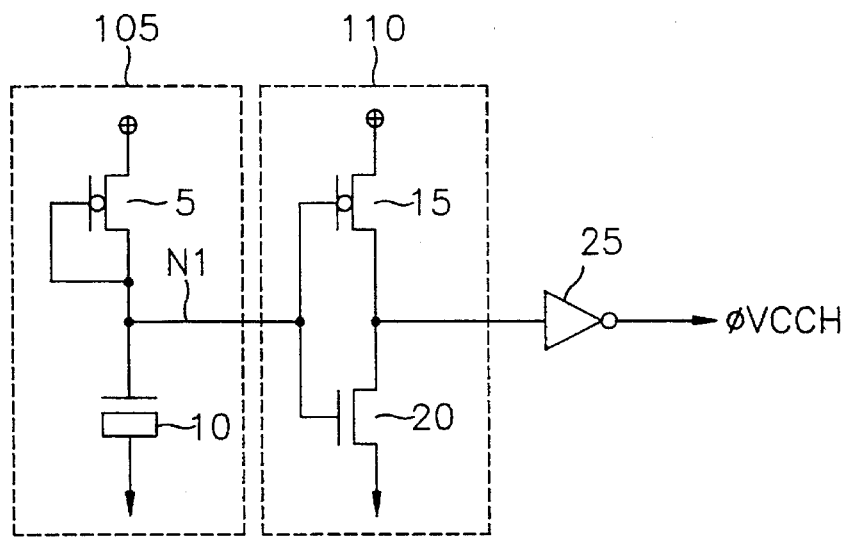
FIG. 1 is a schematic diagram depicting an exemplary conventional chip initialization signal generating circuit.
Figure 3:
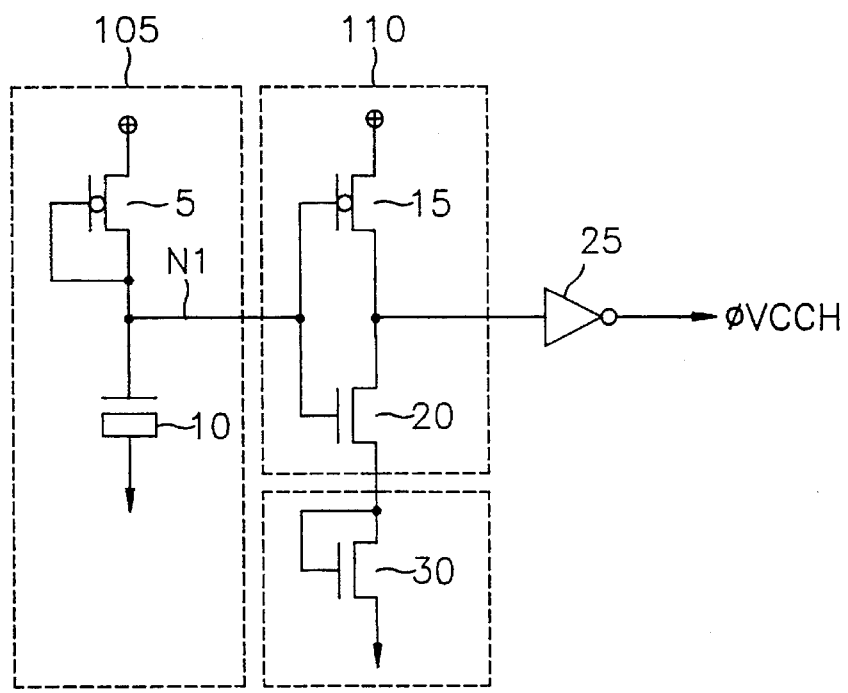
FIG. 3 is a schematic diagram depicting a chip initialization signal generating circuit constructed in accordance with a basic embodiment of the present invention.

With reference now to FIG. 3, there can be seen a chip initialization signal generating circuit embodying the basic inventive concept of the present invention. The circuit shown in FIG. 3 includes a time delay circuit 105, a first inverter 110, a second inverter 25, and a trip point level raising circuit 30. The time delay circuit 105, the first inverter 110, and the second inverter 25 are suitably of the same construction as the corresponding elements of the exemplary conventional chip initialization signal generating circuit depicted in FIG. 1, and thus, are numbered identically. Thus, it can be seen that a basic aspect of the present invention resides in the provision of a trip point level raising circuit 30 which functions to raise the trip point level of the first ivnerter 110, to thereby prevent the premature generation of the chip initialization signal ØVCCH. In this embodiment, the trip point level raising circuit 30 includes a single diode-connected NMOS transistor 30 connected between the source electrode of the NMOS transistor 20 of the first inverter 110, and a reference potential, such as ground. With this embodiment, the trip point level of the first inverter 110 is raised by the threshold voltage, Vth, of the diode-connected NMOS transistor 30. Thus, the first inverter 110 will not be tripped until the output signal of the time delay circuit 105 appearing at node N1 reaches the normal trip point level of the first inverter 110+ the threshold voltage, Vth, of the diode-connected NMOS transistor 30, thereby allowing the power supply voltage to attain a higher voltage level prior to generation of the chip initialization signal ØVCCH by the second inverter 25.

Figure 2:
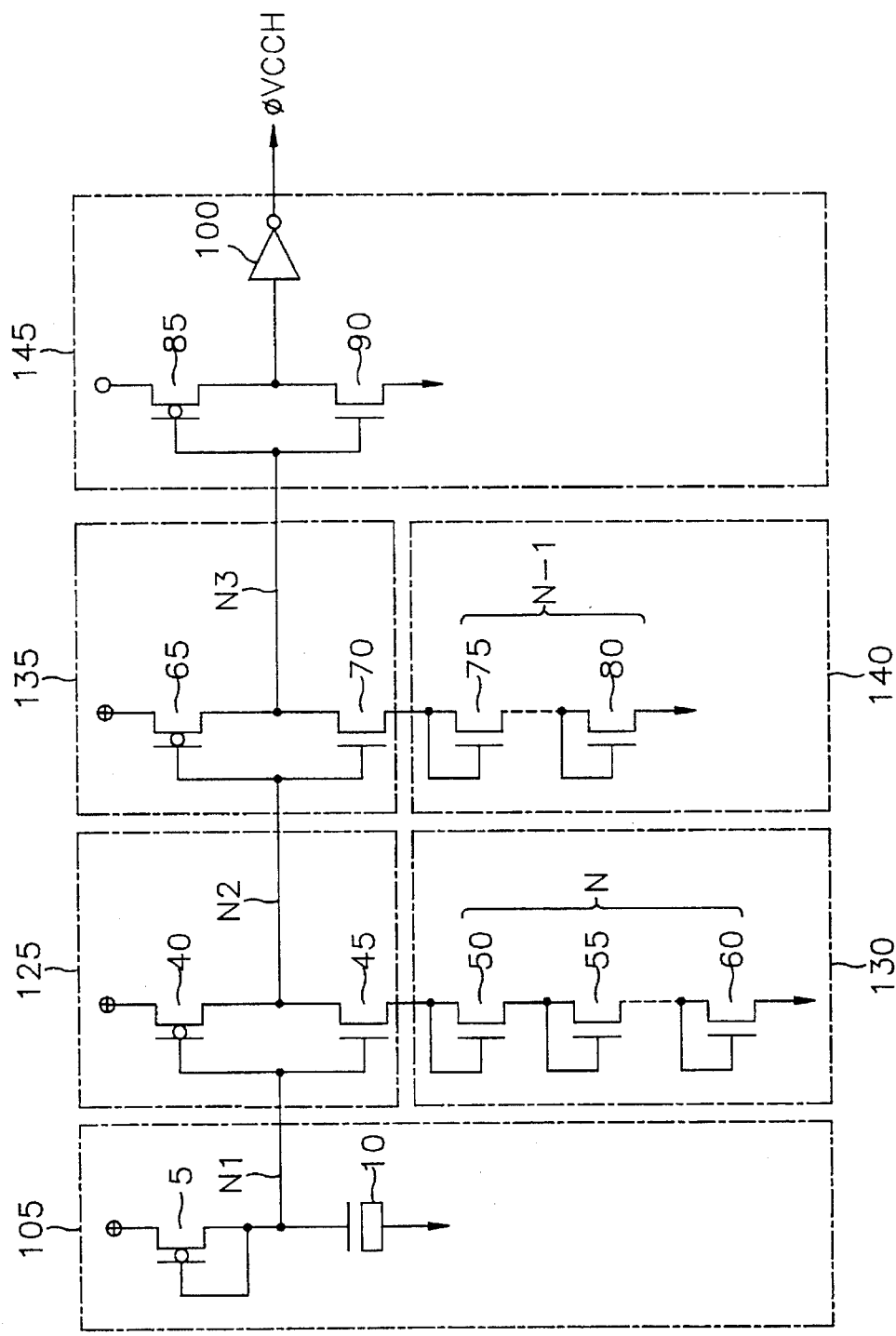
FIG. 2 is a schematic diagram depicting a chip initialization signal generating circuit constructed in accordance with a first preferred embodiment of the present invention.

With reference now to FIG. 2, there can be seen a first preferred embodiment of the chip initialization signal generating circuit of the present invention, which includes a time delay circuit 105, a first inverter 125, a trip point level raising circuit 130, a second inverter 135, a direct current (DC) path cutoff circuit 140, and a buffer circuit 145.

The time delay circuit 105 is suitably of conventional construction, although it should be appreciated that the specific implementation of this circuit element is not limiting to the present invention. The first inverter 125 is preferably embodied as a CMOS inverter comprised of a PMOS transistor 40 and an NMOS transistor 45 connected in series between the power supply voltage and the trip point level raising circuit 130, with the gate electrodes of the transistors 40, 45 being commonly coupled to the output node N1 of the time delay circuit 105.

The trip point level raising circuit 130 preferably includes a plurality, N, of diode-connected NMOS transistors, 50, 55, and 60, connected in series between the source electrode of the NMOS transistor 45 and a reference potential, such as ground. The second inverter 135 is also preferably embodied as a CMOS inverter comprised of a PMOS transistor 65 and an NMOS transistor 70 connected in series between the power supply voltage and the DC path cutoff circuit 140, with the gate electrodes of the transistors 65, 70 being commonly coupled to the output node N2 of the first inverter 125.

The DC path cutoff circuit 140 preferably includes a plurality, N–1, of diode-connected NMOS transistors, 75, 80, connected in series between the source electrode of the NMOS transistor 70 and a reference potential, such as ground.

The buffer circuit 145 preferably includes a plurality, and particularly, an even number, of CMOS inverters, the first of which includes a PMOS transistor 85 and an NMOS transistor 90 connected in series between the power supply voltage and a reference potential, such as ground, with the gate electrodes of the transistors 85, 90 being commonly coupled to the output node N3 of the second inverter 135. The final inverter 100 produces the chip initialization signal ØVCCH.

Assuming that the threshold voltage, Vth, of each of the diode-connected NMOS transistors 50, 55, and 60 are the same, the first inverter 125 is tripped only after the voltage on the output node N1 of the time delay circuit 105 reaches a voltage level equal to the normal trip point level of the first inverter +N×Vth. Thus, the trip point level of the first inverter 125 is raised by N×Vth.

If the DC path cutoff circuit 140 were not provided, then the voltage (N×Vth) on the output node N2 of the first inverter 125, when the first inverter 125 is tripped, would simultaneously turn on the PMOS and NMOS transistors, 65, 70, respectively, of the second inverter 135, thus forming a DC path through the second inverter 135, thereby resulting in improper operation of the circuit. In order to eliminate this DC path, the DC path cutoff circuit 140, comprised of the N–1 diode-connected NMOS transistors, 75, 80, is provided. With the DC path cutoff circuit 140, the gate-source voltage of the NMOS transistor 70 becomes |Vth|, whereby the NMOS transistor 70 is turned off and the PMOS transistor 65 turned on when the output of the first inverter 125 transitions in response to the output node N1 of the time delay circuit 105 reaching the raised trip point level of the second inverter 125, thus resulting in the output node N3 of the second inverter 135 being driven to a logic "high" level. The desired shape of the chip initialization signal ØVCCH can be achieved by appropriately adjusting the number of inverters utilized in the buffer circuit 145. Preferably, the buffer circuit 145 includes an even number of inverters.

Figure 4:
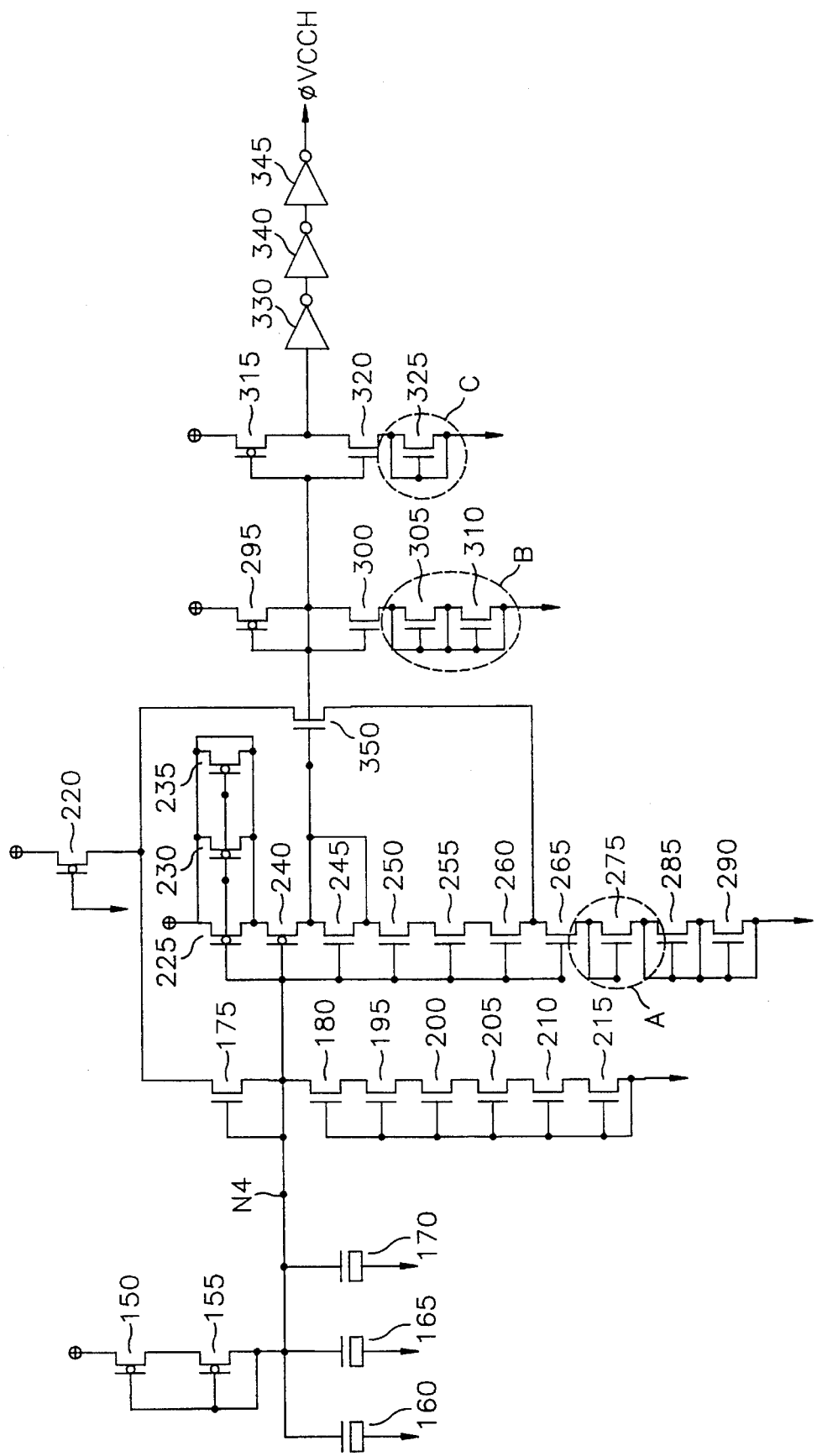
FIG. 4 is a schematic diagram depicting a chip initialization signal generating circuit constructed in accordance with a second preferred embodiment of the present invention; and, FIGS. 5A and 5B are simulation graphs of the chip initialization signal generated by the circuit depicted in FIG. 4 before and after a diode-connected NMOS transistor 275 is added thereto, respectively.
Figures 5A, 5B:
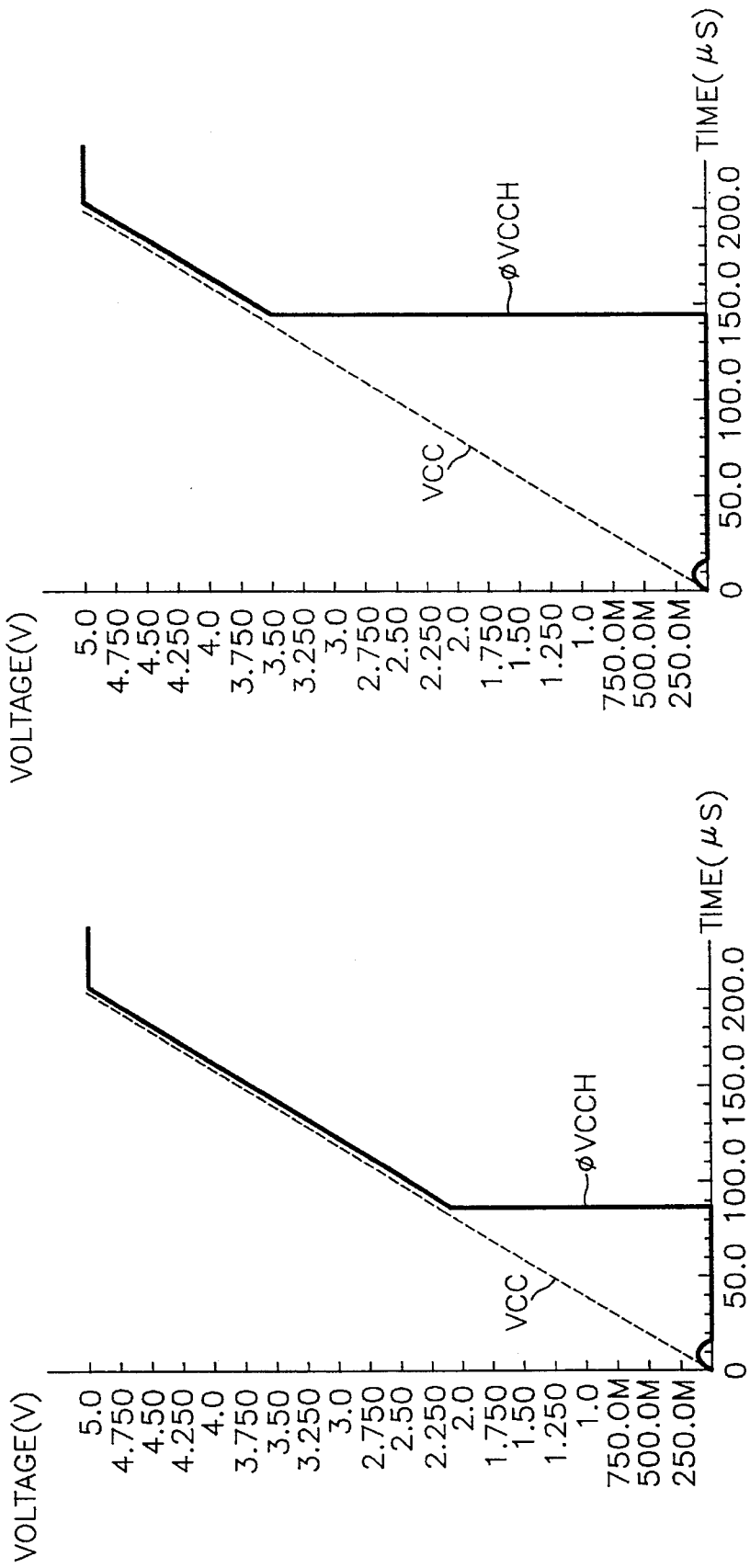

With reference now to FIG. 4, there can be seen a second preferred embodiment of a chip initialization signal generating circuit of the present invention. Since the details of the construction and operation of this circuit would be readily apparent to a person of ordinary skill in the pertinent art, and, in any event, are not essential to the presently claimed invention, they will not be described herein. Rather, this embodiment of the present invention was utilized to conduct a simulation of the efficacy of the present invention. More particularly, FIGS. 5A and 5B illustrate, respectively, the chip initialization signal ØVCCH generated by the circuit illustrated in FIG. 4 before and after the addition of the diode-connected NMOS transistor 275. As can be seen in FIG. 5A, using the circuit depicted in FIG. 4, without the diode-connected NMOS transistor 275, after 87 µs from power-up, a chip initialization signal ØVCCH having a voltage level of approximately 2.25 volts is generated. As can be seen in FIG. 5B, using the circuit depicted in FIG. 4, with the diode-connected NMOS transistor 275, after 145 µs from power-up, a chip initialization signal ØVCCH having a stable operating voltage level of approximately 3.65 volts is generated, thus demonstrating the efficacy of the trip point level raising circuit (in this case, the diode-connected NMOS transistor 275) of the present invention.

Although the present invention has been described hereinabove in connection with several, specific, preferred embodiments thereof, it should be clearly understood that many variations and/or modifications of the basic inventive concepts herein taught which may appear to those skilled in the art will still fall within the spirit and scope of the present invention as defined in the appended claims.

What is claimed is:

1. A circuit, comprising:

a time delay circuit for generating a second signal a predetermined time after a first signal is applied thereto;

a first inverter circuit coupled to said second signal for generating a third signal, said third signal having a first logic level when said second signal is below a trip point level, and a second logic level when said second signal is above said trip point level;

a trip point level raising circuit coupled to said first inverter circuit for raising said trip point level, said trip point level raising circuit being comprised of N diode-connected MOS transistors coupled in series between a reference potential and a first electrode of a MOS transistor of said first inverter circuit, where N is greater than or equal to three; and, a second inverter circuit coupled to said third signal for generating a fourth signal having a logic level which is the inverse of said third signal;

a direct current path cutoff circuit comprised of N–1 diode-connected MOS transistors coupled in series between said reference potential and a first electrode of a MOS transistor of said second inverter circuit.

2. The circuit as set forth in claim 1, further comprising a buffer circuit coupled to receive said fourth signal, for shaping said fourth signal.

3. The circuit as set forth in claim 2, wherein said fourth signal comprises a chip initialization signal for initializing circuits of semiconductor memory device.

4. The circuit as set forth in claim 3, wherein said first signal comprises a power supply voltage of said semiconductor memory device.

5. The circuit as set forth in claim 1, wherein said time delay circuit comprises:

a MOS transistor having a first electrode coupled to said first signal, a gate electrode, and a second electrode coupled to said gate electrode;

a capacitor having a first node coupled to said second electrode of said MOS transistor, and a second mode coupled to a reference potential; and, wherein said second signal is generated at an output node intermediate said first node of said capacitor and said second electrode of said MOS transistor.

6. The circuit as set forth in claim 5, further comprising a buffer circuit coupled to receive said fourth signal for shaping said fourth signal.

7. The circuit as set forth in claim 6, wherein said buffer circuit comprises a plurality of inverters.

8. The circuit as set forth in claim 1, wherein said time delay circuit comprises:

a resistor element having a first node coupled to said first signal, and a second node;

a capacitor coupled between said second node of said resistor element and a reference potential; and, wherein said second signal appears at an output node intermediate said second node of said resistor element and said capacitor.

\* \* \* \* \*